United States Patent [19]

Miyake et al.

[11] Patent Number: 5,282,165
[45] Date of Patent: Jan. 25, 1994

[54] RANDOM ACCESS MEMORY WITH REDUNDANCY REPAIR CIRCUIT

[75] Inventors: Naomi Miyake, Takatsuki; Tatsumi Sumi, Mishima, both of Japan

[73] Assignee: Matsushita Electric Industrial Co., Ltd., Osaka, Japan

[21] Appl. No.: 696,944

[22] Filed: May 8, 1991

[30] Foreign Application Priority Data

May 8, 1990 [JP] Japan .................................. 2-118896

[51] Int. Cl.$^5$ .............................................. G11C 7/00
[52] U.S. Cl. .................................. 365/200; 365/225.7
[58] Field of Search ............ 365/200, 203, 210, 225.7; 371/10.1

[56] References Cited

U.S. PATENT DOCUMENTS 4,734,889 3/1988 Mashiko et al. .................. 365/200

FOREIGN PATENT DOCUMENTS

0195631A3 9/1986 European Pat. Off. .
2070883 9/1971 France .

*Primary Examiner*—Steven Mottola
*Attorney, Agent, or Firm*—Wenderoth, Lind & Ponack

[57] ABSTRACT

A random access memory includes a redundancy repair circuit having a plurality of parallel connected transistors and a plurality of fuses connected to respective drains of the plurality of transistors. An electrically resistive element is connected to a common node to reduce a difference in operating speeds between a first case in which the circuit is precharged from a state in which discharge to a low level was effected via one of the transistors and a case in which precharging of the circuit is effected from a state in which discharging was carried out via a plurality of the transistors.

2 Claims, 4 Drawing Sheets

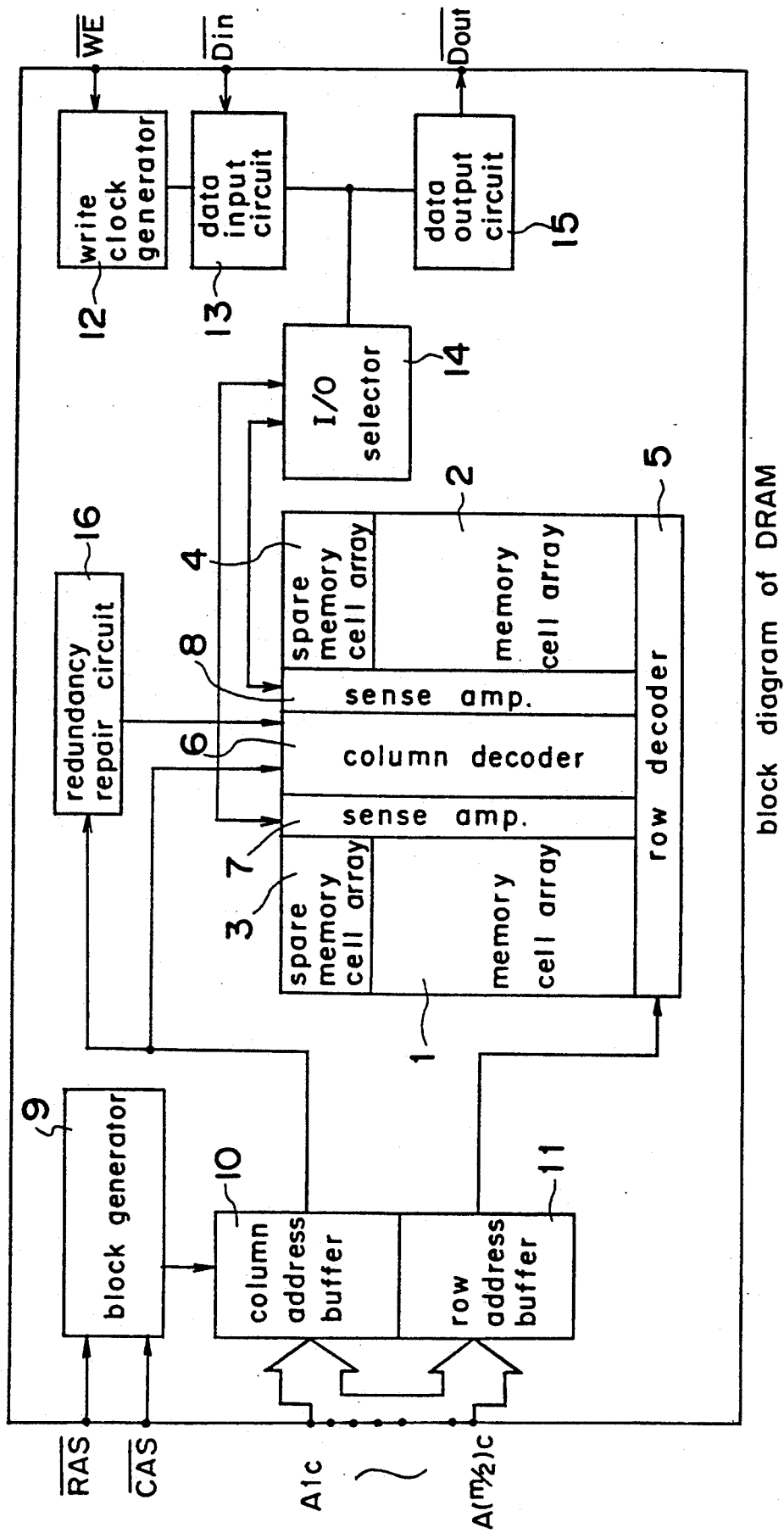
Fig. 4  block diagram of DRAM

RANDOM ACCESS MEMORY WITH REDUNDANCY REPAIR CIRCUIT

BACKGROUND OF THE INVENTION

The present invention generally relates to a random access memory having a redundancy repair circuit.

In recent years, a redundancy repair circuit is often used in DRAM to replace defective normal memory cells with spare memory cells.

However, in conventional DRAMs, when the defective normal memory cells are replaced with the spare memory cells, the total resistance value between the precharged node and the grounding potential is substantially changed in accordance with an address signal. As a result, the operation timing of inner circuits is deviated, thereby causing the DRAMs to malfunctions.

SUMMARY OF THE INVENTION

Accordingly, the present invention has been developed with a view to substantially eliminating the above discussed drawbacks inherent in the prior art and has for its essential object to provide an improved redundancy repair circuit.

Another important object of the present invention is to provide a redundancy repair circuit of the type referred to above, which is adapted to improve the switching voltage level of the operation for precharging a node from a condition where the level has been lowered to a low level by a plurality of transistors to equalize the switching level independently of the number of the transistors for drawing out the node into the low level.

In accomplishing these and other objects, according to one preferred embodiment of the present invention, the redundancy repair circuit is adapted to ground common nodes through a resistor, or through a transistor resistance, use with a ground node.

In this construction, a constant series resistance is added to reduce an overall resistance variation of the circuit, and to thus reduce an input switching voltage level variation, thereby reducing the difference in the operation times.

BRIEF DESCRIPTION OF THE DRAWINGS

These and other objects and features of the present invention will became apparent from the following description taken in conjunction with the preferred embodiment thereof with reference to the accompanying drawings, in which;

FIG. 4 is a block diagram of a DRAM including the redundancy repair circuit and column decoder.

DETAILED DESCRIPTION OF THE INVENTION

Figure 1:
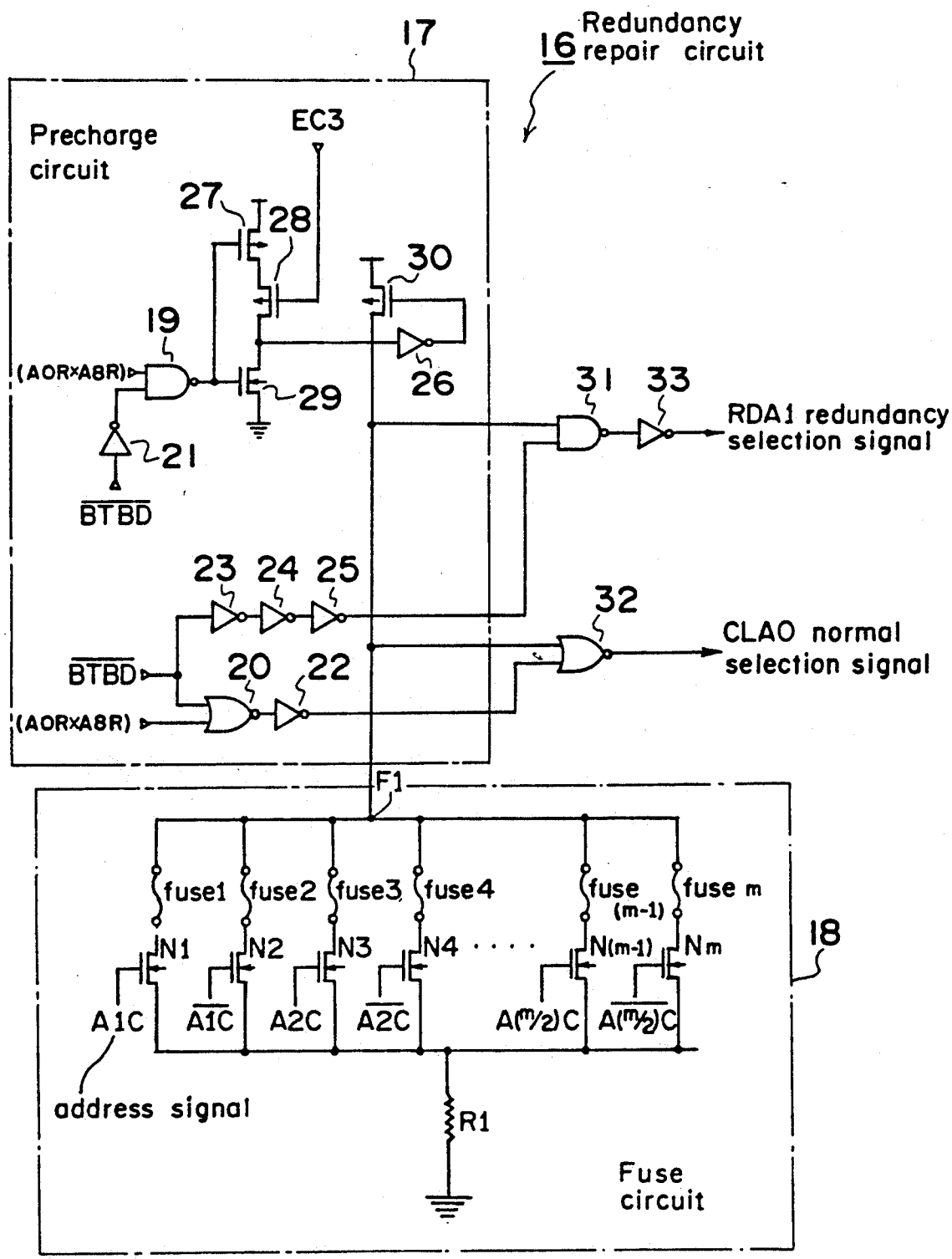
FIG. 1 is a redundancy repair circuit diagram in a first embodiment of the present invention.

FIG. 4 shows a block diagram of DRAM having a redundancy repair circuit 16. A plurality of memory cells (not shown) are arranged in a matrix in regions of memory cell arrays 1 and 2. Spare memory cell arrays 3 and 4 are disposed adjacent to the memory cell arrays 1 and 2, respectively. A row decoder 5 is electrically connected to the memory cell arrays 1-4, and a column decoder 6 is electrically connected to the memory cell arrays 1-4 through sense amplifiers 7 and 8. The arrangement of FIG. 4 constitutes a address multiplex system type DRAM in which column address signals and row address signals are supplied in series to the address input terminals A1C−A(m/2)C, and a block generator 9 controls a column address buffer 10 and a row address buffer 11 so as to select a column address signal or a row address signal according to the row address strobe $\overline{RAS}$ and column address strobe $\overline{CAS}$. For example, when the row address strobe $\overline{RAS}$ is a low level and the column address strobe $\overline{CAS}$ is a high level, the block generator 9 selects the row address buffer 11, and address signals supplied to the address input terminals A1C−A(m/2)C are transmitted from the row address buffer 11 to the row decoder 5 as row address signals. On the other hand, when the row address strobe $\overline{RAS}$ is a low level and the column address strobe $\overline{CAS}$ is also a low level, column address signals are transmitted from the column address buffer 10 to the column decoder 6. As a result, a specific memory cell in the memory cell arrays 1 and 2 is accessed by the row address signal and column address signal.

When the data is written in an accessed memory cell, the write enable signal $\overline{WE}$ becomes a low level, for instance, and a write clock generator 12 activates a data input circuit 13. Data to be written is supplied to the data input terminal $\overline{Din}$ and transmitted to the sense amplifiers 7 and 8 through the data input circuit 13 and an I/O selector 14. Then the data is amplified by the sense amplifiers 7 and 8 and is written into the accessed memory cell.

When the data is read out, a specific memory cell is accessed by the row address signal and column address signal, and the data stored in the accessed memory cell is read out as applied to the data output terminal $\overline{Dout}$ through the sense amplifiers 7 and 8, I/O selector 14 and data output circuit 15.

In addition to the above construction, a redundancy repair circuit 16 is connected between the column address buffer 10 and column decoder 6.

Figure 3:
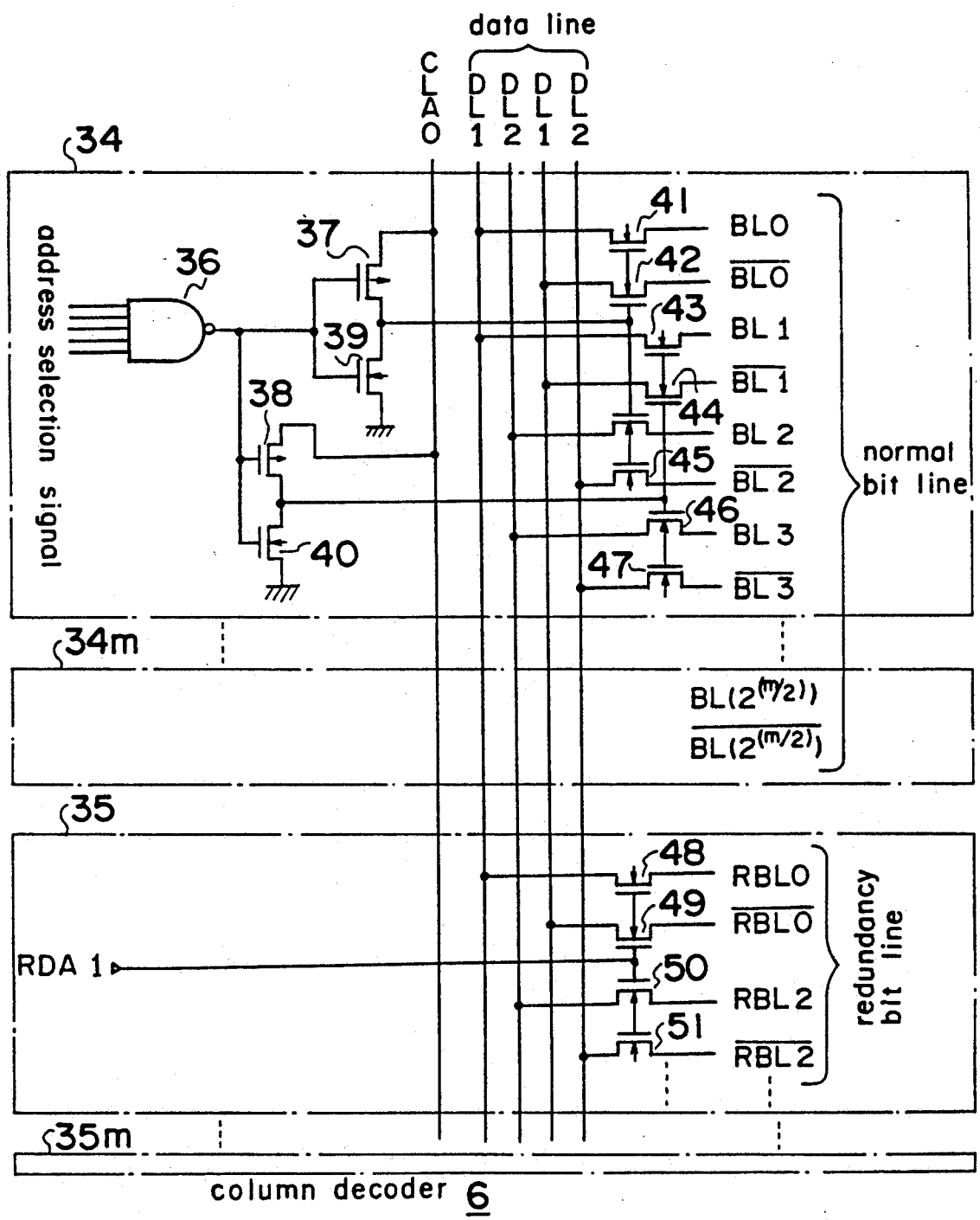
FIG. 3 is a column decoder diagram to be connect with the redundancy repair circuit.

FIG. 1 shows a detailed construction of the redundancy repair circuit 16 according to a first embodiment of the present invention. FIG. 3 shows a detailed construction of the column decoder 6 shown in FIG. 4.

As shown in FIG. 1, the redundancy repair circuit 16 is basically comprised of a precharge circuit 17 and a fuse circuit 18. The precharge circuit 17 includes a NAND gate 19, a NOR gate 20, inverters 22-26, P channel transistors 27, 28 and N channel transistors 29, 30. The fuse circuit 18 includes N channel transistors N1-Nm, fuses 1-m and a resistance R1. The fuses 1-m are connected between the node F1 and the respective drains of the transistors N1-Nm. All sources of the transistors N1-Nm are commonly connected to the grounding potential through the resistance R1. Address signals A1C−A(m/2)C shown in FIG. 1 are transmitted to the respective gate of the transistors N1-Nm through the column address buffer 10. One address signal transmitted to the gate of the transistors N1-Nm is defined by a pair of address signals. For example, the address signal A1C is defined by A1C and $\overline{A1C}$, and A1C is supplied to the gate of the transistor N1, and $\overline{A1C}$ is supplied to the gate of the transistor N2 at the same time. Similarly, the address signal A/m/2)C is supplied to the gates of the transistors N(m−1) and Nm as A(m/2)C and $\overline{A(m/2)C}$, respectively.

The node F1 of the fuse circuit 18 is connected to the source of the transistor 30, one input terminal of a NAND gate 31 and one input terminal of a NOR gate 32. Output terminals of the inverters 25 and 22 are connected to the other input terminals of the NAND gate 31 and NOR gate 32, respectively. Inverter 33 is connected to the output terminal of the NAND gate 31.

The column decoder 6 shown in FIG. 3 is basically comprised of a plurality of normal bit line blocks 34-34m and a plurality of redundancy bit line blocks. For the sake of simplicity, only one redundancy bit line block 35 is shown in detail in FIG. 3. Normal bit line block 34 includes a NAND gate 36, P channel transistors 37, 38 and N channel transistors 39-47. N channel transistors 41-47 are connected in series to the normal bit lines BL0, $\overline{BL0}$, . . . , BL3, $\overline{BL3}$, respectively. The other normal bit line blocks, such as a block 34m, have the same construction as block 34. In other words, in this embodiment, eight normal bit lines shown in the block 34 are provided respectively up to the block 34m. A plurality of redundancy bit line blocks are provided in correspondence with a plurality of normal bit line blocks. As to the redundancy bit line block 35, N channel transistors 48-51 are connected in series to the redundancy bit lines RBL0, $\overline{RBL0}$, RBL2, $\overline{RBL2}$. Although only four redundancy bit lines RBL0-$\overline{RBL2}$ are shown in the block 35 of FIG. 3 for simplicity, the eight redundancy bit lines corresponding to the eight normal bit lines BL0-$\overline{BL3}$ are connected in the actual circuit. Data lines DL1, DL2, $\overline{DL1}$, $\overline{DL2}$ are connected to the normal lines and redundancy bit lines as shown in FIG. 4.

Referring now to the FIGS. 1, 3 and 4, the detailed operation of the first embodiment of the present invention is explained below.

Normal Operation

In the normal operation, normal memory cells disposed in the memory cell arrays 1 and 2 are accessed. In a 1 mega bit DRAM (1MDRAM), for example, inner signals A0R-A9R are used for controlling inner circuits. The other inner signals $\overline{BTBD}$ and EC3 are also used for controlling inner circuits. These inner signals do not necessarily relate to the essential operation of the redundancy repair function, therefore a detailed timing chart thereof is not shown.

At the address signal input timing, both inner signals A0R and A8R are a high level or low level. Accordingly, the input signal A0R×A8R supplied to the input terminals of NAND gate 19 and NOR gate 20 is a high level. On the other hand, at this timing, the other inner signals $\overline{BTBD}$ and EC3 are a low level. As a result, the output signal of the NAND gate 19 becomes a low level, and P channel transistors 27, 28 turn on, and the N channel transistor 29 turns off. Accordingly, current flows from the power supply terminal to the inverter 26 through P channel transistors 27 and 28, and the P channel transistor 30 turns on. As a result, current flows from the power supply terminal to the node F1 and respective input terminal of the NAND gate 31 and NOR gate 32. Thus, the node F1 of the fuse circuit 18 is precharged.

Under such a condition, when a specific address signal is supplied to one or more gates of the transistors N1-m in the fuse circuit 18 so as to select a normal bit line, current flows from the node F1 through one or more fuses, through one or more transistors turned on by the address signal and through the resistance R1 to the grounding potential. As a result, the potential of node F1 becomes a low level, and the signal level of the respective one terminal of the NAND gate 31 and NOR gate 32 also becomes a low level. On the other hand, at this timing, since the inner signal $\overline{BTBD}$ is a low level and the inner signal A0R×A8R is a high level, the output signals of inverters 22 and 25 are a high level. Therefore, the redundancy selection signal RDA1 becomes a low level, and the normal selection signal CLA0 becomes a high level. These selection signals RDA1 and CLA0 are transmitted to the column decoder 6 shown in FIG. 3.

In FIG. 3, the address selection signal is a kind of inner signal, and the output signal level of NAND gate 36 is kept at a low level during the bit line selection operation. As described above, at this timing, since the normal selection signal CLA0 is a high level, P channel transistors 37, 38 turn on, and N channel transistors 39, 40 turn off. As a result, the normal selection signal CLA0 of a high level is supplied to the gates of all N channel transistors 41-47 through the P channel transistors 37 and 38. Accordingly, normal bit lines BL0-BL($2^{(m/2)}$) are selected. At this timing, the redundancy selection signal RDA1 of a low level is supplied to the gates of all N channel transistors 48-51, and these transistors are turned off. Therefore, the redundancy bit lines RBL0-$\overline{RBL2}$ are not selected.

Redundancy Repair Operation

When one or more memory cells included in the normal bit line block 34 have defects and do not function properly, the normal bit line block 34 is replaced by the redundancy bit line block 35. For this purpose, two or more fuses which correspond to the required address are blown out. As a result, when the address signals A1C-A(m/2)C are supplied to the gates of transistors N1-Nm, even if one or more transistors turn on, the fuses connected to such transistors are blown out, the current does not flow from the node F1 to the grounding potential. Accordingly, the potential of the node F1 is maintained at a precharged (high) level. Consequently, the redundancy selection signal RDA1, RDA1 becomes a high level, and the normal selection signal CLA0 becomes a low level. These selection signals are transmitted to the column decoder 6 shown in FIG. 3. Since this timing is a bit line selection timing, the output signal of the NAND gate 36 is a low level, and the P channel transistors 37, 38 turn on, and the N channel transistors 39, 40 turn off. As a result, the normal selection signal CLA0 of a low level is transmitted to the gates of transistors 41-47 through transistors 37 and 38, and all transistors 41-47 are turned off, thereby separating the normal bit lines BL0-$\overline{BL(2^{(m/2)})}$ from the data lines DL1, DL2, $\overline{DL1}$, $\overline{DL2}$. On the other hand, the redundancy selection signal RDA1 of a high level is supplied to the gates of transistors RBL0-$\overline{RBL2}$, and all these transistors RBL0-$\overline{RBL2}$ are turned on. Consequently, all redundancy bit lines RBL0-$\overline{RBL2}$ are connected to the data lines DL1, DL2, $\overline{DL1}$, $\overline{DL2}$ instead of the normal bit lines BL0-$\overline{BL(2^{(m/2)})}$. The redundancy repair for the circuit is executed as described above.

Meanwhile, under the condition that some fuses are blown out in order to repair a specific normal bit line block selected by a specific address, when another address adjacent to such specific address is elected, only one transistor among the transistors N1-Nm is turned on and the fuse connected to the drain of the one transistor is not blown out. Therefore, in this case, current flows from the node F1 to the grounding potential through one fuse, one transistor and the resistance R1. In other cases, two or more transistors among the transistors N1–Nm turn on according to the various combination of the address signals A1C–A(m/2)C, and in these cases, the number of current paths varies. As a result, the total resistance between the node F1 and grounding potential varies in accordance with the number of transistors turned on.

As is well known, on resistance (Ron) of a transistor is expressed as the following formulas (1)-(3).

$$Ron = \frac{1}{2 \times b \times (Vgs - Vt)} \quad (1)$$

$$b = K \times (W/L) \quad (2)$$

$$K = \frac{1}{2 \times t \times Cox} \quad (3)$$

b: Gain coefficient
M: Mobility of electrons and holes
Cox: Capacitance of gate oxide film
Vgs: Voltage between gate and source
Vt: Threshold voltage
W: Gate width
L: Gate length When only one transistor turns on, the total resistance between the node F1 and grounding potential is (Rf+Ron+R1), wherein Rf is the resistance of a fuse. However, when several transistors turn on, the total resistance between the node F1 and the grounding potential is (Rf'+Ron'+R1), wherein Rf' is a total resistance of several fuses connected in parallel, and Ron' is a total resistance of several transistors connected in parallel. Since Rf' is smaller than Rf, and Ron' is smaller than Ron, (Rf'+Ron'+R1) is smaller than (Rf+Ron+R1). Therefore, when only one transistor turns on, the precharged potential of the node F1 decreases gradually toward the grounding potential due to the large resistance. On the other hand, when several transistors turn on, the precharged potential of the node F1 decreases more rapidly due to the small resistance.

Here, if the sources of transistors N1–Nm are directly connected to the grounding potential, the total resistance between the node F1 and the grounding potential varies from (Rf+Ron) to (Rf'+Ron'). This variation range is greater than that of the first embodiment of the present invention. This causes the difference of precharge time of the node F1 according to the various address signals, and further causes the deviation of the operation timing of the inner circuits. This problem becomes more serious when the DRAM operation speed is higher.

However, in the first embodiment of the present invention, when the precharging operation is effected from a condition where the node F1 has been drawn out into the low level in one transistor by a resistor R1 connected in series between the common source of the transistors N1–Nm and the grounding potential, the on resistance on the earth ground side becomes a total of the on resistance Ron of the transistor and the resistance R1. When the precharging operation has been effected from a condition where the node F1 has been discharged to the low level via a plurality n number of transistors, the on resistance on the earth ground side becomes a total of the on resistance Ron/n of the transistors and the resistance R1. As a result, the resistance Rnch of the N channel transistor on the fuse side becomes a value between when the precharging operation is effected from a condition where the node F1 has been discharged to the low level via one transistor and when the precharging operation is effected from a condition where the node F1 has been discharged to the low level via a plurality n number of transistors.

$$R1 + Ron \leq Rnch \leq R1 + Ron/n \quad (4)$$

The proportional change in the resistance at this time is as follows.

$$\frac{Ron(1 - 1/n)}{R1 + Ron(1 + n)/2n} \quad (5)$$

In the conventional case with no R1

$$\frac{Ron(1 - 1/n)}{Ron(1 + n)/2n} \quad (6)$$

wherein R1=0 in the (5) formula.

$$\frac{1}{1 + (R1/Ron) \ast (2n/(1 + n))} < 1 \quad (7)$$

wherein ((5)/(6)).

The ratio of the change in the resistance of the N channel transistor on the fuse side when the precharging operation is effected from a condition where the node F1 has been discharged to the low level in one transistor and when the precharging operation is effected from a condition where the node F1 has been discharged to the low level via n number of transistors is found from the formula (7) that the present invention with the resistor R1 existing may be made 1 or less, having the conventional circuit with no resistor R1 being provided as the reference.

In the present embodiment as described hereinabove, as the difference of the changes in the precharging operation may be effected in a case where the precharging operation is effected from a condition where the node F1 is discharged to the low level via one transistor, and in a case where the precharging operation is effected from a condition where the node F1 is discharged to the low level via n number transistors, it is possible to determine the difference of the operation speed caused in the number of the discharging transistors caused by the fact that the input signal waveforms of the address are not complete rectangular waves. The on resistance in the precharging operation from the condition where the node F1 has been discharged to the low level via a plurality n number of transistors is increased, so that the switching voltage level becomes higher, with the result being that the operation speed my be increased.

Meanwhile, the resistance value of the resistor R1 is preferably set within the range from one on resistance to m on resistance (Ron–m.Ron). In other words, the resistance value of the electric resistor is less than one on resistance and 1/m or more on resistance of the m number of the transistors.

Figure 2:
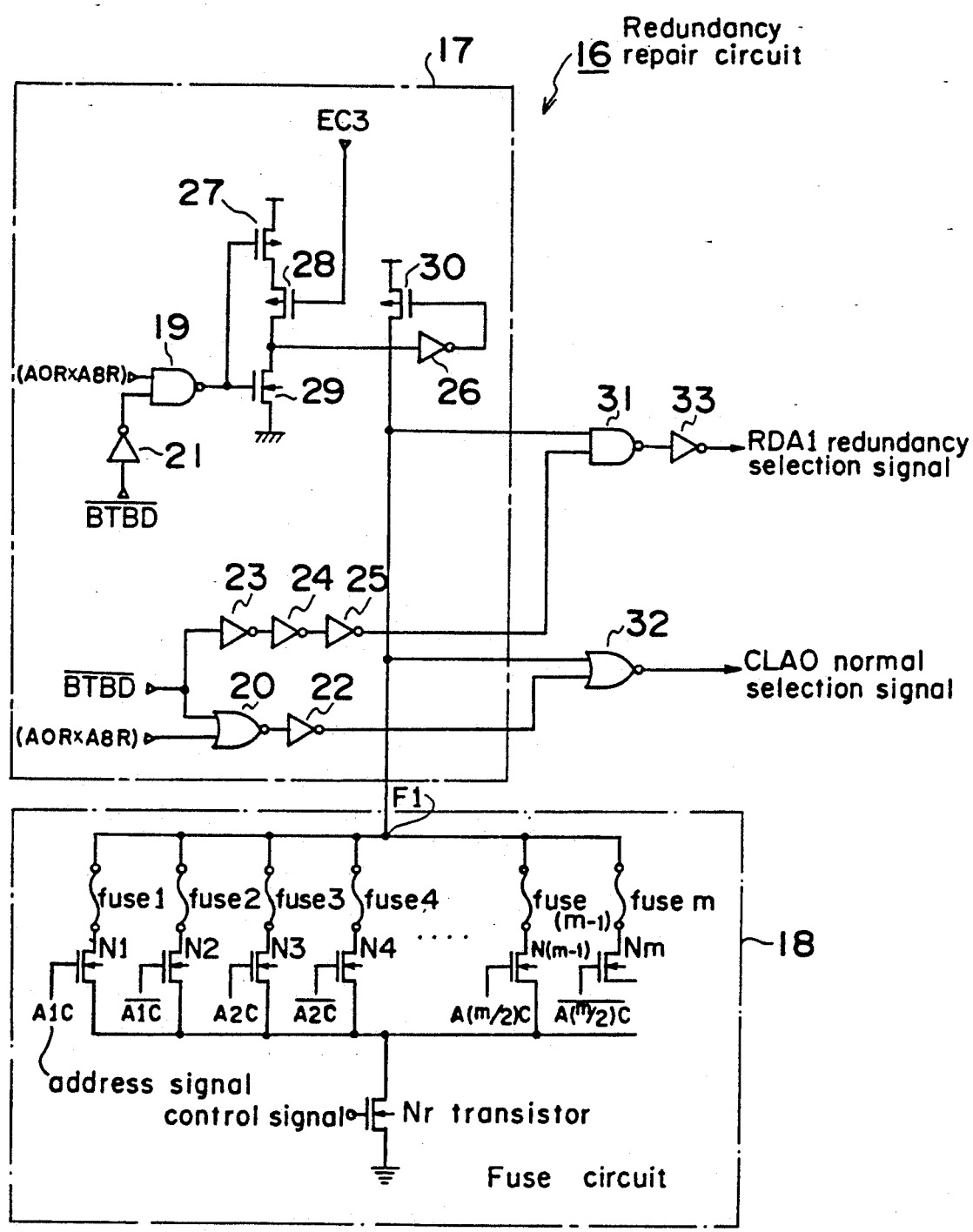
FIG. 2 is a redundancy repair circuit diagram in a second embodiment of the present invention.

A second embodiment will be described hereinafter with reference to the drawings. FIG. 2 is a redundancy relief circuit in the second embodiment of the present invention. The difference from the construction of FIG. 1 is that the resistor R1 of FIG. 1 is replaced by a transistor Nr.

The redundancy repair circuit constructed as described hereinabove will be described in its operation.

The operation of the present circuit is fundamentally the same as the operation of a circuit disposed through the electric resistor in the embodiment of FIG. 1. When the precharging is effected from a condition where the node F1 has been discharged to the low level via one transistor, and when the precharging operation is effected from a condition where the node F1 is discharged to the low level via n number of transistors, the difference of the input switching level may be reduced so as to function to compress the difference of the operating speed which is caused by the fact that the address signal waveform is not the complete rectangular wave. In the present invention, the electric resistor is replaced by the transistor. The present invention is different in the electric resistor composed by polycilicone which forms the gate of the transistor. From the manufacturing points of view, the resistor is composed of transistors which are the same in construction as the N channel transistors arranged by m number in parallel. The dispersion is made the same. The resistance value is easy to control.

The electric resistor in a first embodiment is replaced by the transistor as shown in the second embodiment, so that the resistance is easy to control. The gate input of the Nr transistor may be controlled, so that the resistance value may be externally controlled, and the highly efficient redundancy repair circuit may be manufactured with the freedom degree of use being improved.

The effect of the Nr transistor has been described hereinabove. The optimum range of the transistor will be described hereinafter. Assume that the channel width W of the Nr transistor is one N channel transistor or less, and the switching voltage level becomes higher when the precharging operation is effected from a condition where the node F1 has been discharged the low level via the n number of transistors, with the result that the operation may be made faster. However, in the case of the selection of the storing node adjacent to the redundancy address, the current performance is too low and the normal selection signal CLA0 does not switch to a high level, but the redundancy selection signal RDA1 is possible to change to a high level. Assume that the channel width W of the Nr transistor is m number or more, the current performance becomes excessive. When the precharging operation is effected from a condition where the node F1 has been discharged to the low level via a plurality n number of transistors, there is possibility that the switching voltage level cannot be obtained sufficiently. If the channel length L of the Nr transistor is the same as the N channel transistor arranged by m number in parallel as above described, it is optimum in range that the channel width W of the Nr transistor is one N channel transistor arranged by m number in parallel or more and by m number or less.

The channel width W of the transistor is one channel width or more of the transistor disposed in parallel, is m number or less. In a circuit composed of m number of P channel transistors disposed in parallel, the resistor or the transistor is connected between the common source of the P channel transistors and the power supply potential, so that the same effect as the circuit of the N channel may be, needless to say, obtained. Although a case where the resistor or the transistor is inserted between the common source and the power supply potential, the same effect is provided if the resistor or the transistor for resistance use is inserted between the common fuse and the node F1.

As is clear from the foregoing description, according to the arrangement of the present invention, by transistors arranged by m number in parallel of the fuse circuit in the redundancy circuit, the on resistance, the switching level may be controlled by the provision of the electric resistor or the transistor. When the precharging operation is effected from a condition where the node F1 has been discharged to the low level via one transistor by the difference between the redundancy address, and when the precharging operation is effected from a condition where the node F1 has been discharged to a low level via n number of transistors, the operation is made faster by the difference in the redundancy address, in a case where the precharging operation is effected from a condition where the node F1 has been discharged to the low level via the n number of transistors, and the difference of the operation in a case where the precharging operation is effected from a condition where the node F1 has been discharged to the low level via one transistor, thus realizing a superior circuit.

What is claimed is:

1. A random access memory including a redundancy repair circuit for replacing a defective memory cell with a spare memory cell, said redundancy repair circuit comprising:

a plurality of transistors, connected to each other in parallel, each having a source, a drain and a gate, wherein each source of said plurality of transistors is connected to a common node, and wherein each gate of said plurality of transistors receives an address signal transmitted within said random access memory;

a plurality of fuses, which are selectively opened to store an address of said defective memory cell, respectively connected to said drains of said plurality of transistors; and, an electrically resistive element connected between said common node and a ground line.

2. A random access memory as claimed in claim 1, wherein said electrically resistive element is a transistor having a gate which receives a control signal for controlling a resistance of said transistor.

* * * * *